(12) United States Patent
Heeren et al.

(10) Patent No.: US 9,786,483 B2
(45) Date of Patent: Oct. 10, 2017

(54) DETECTION OF IONS IN AN ION TRAP

(71) Applicant: FOM INSTITUTE FOR ATOMIC AND MOLECULAR PHYSICS, Amsterdam (NL)

(72) Inventors: Ronald Martinus Alexander Heeren, Weesp (NL); Julia Helga Jungmann, Tallahassee, FL (US); Don Smith, Tallahassee, FL (US)

(73) Assignee: AMSTERDAM SCIENTIFIC INSTRUMENTS HOLDING B.V., Amsterdam (NL)

( * ) Notice: Subject to any disclaimer, the term of this patent is extended or adjusted under 35 U.S.C. 154(b) by 0 days.

(21) Appl. No.: 14/787,081

(22) PCT Filed: Apr. 24, 2014

(86) PCT No.: PCT/EP2014/058402
§ 371 (c)(1),
(2) Date: Oct. 26, 2015

(87) PCT Pub. No.: WO2014/174048
PCT Pub. Date: Oct. 30, 2014

(65) Prior Publication Data
US 2016/0086787 A1    Mar. 24, 2016

(30) Foreign Application Priority Data

Apr. 26, 2013  (EP) .................................... 13165661

(51) Int. Cl.
*H01J 49/38* (2006.01)
*H01J 49/02* (2006.01)
(Continued)

(52) U.S. Cl.
CPC ............ *H01J 49/38* (2013.01); *H01J 49/025* (2013.01); *H01J 49/06* (2013.01); *H01J 49/40* (2013.01);
(Continued)

(58) Field of Classification Search
USPC ......................................................... 250/282
See application file for complete search history.

(56) References Cited

U.S. PATENT DOCUMENTS

| | | | |
|---|---|---|---|
| 5,451,782 A | 9/1995 | Kelley | |
| 5,625,186 A * | 4/1997 | Frankevich | H01J 49/027 250/282 |

(Continued)

OTHER PUBLICATIONS

Julia H. Jungmann et al., "An in-vacuum, pixelated detection system for mass spectrometric analysis and imaging of macromolecules," International Journal of Mass Spectrometry, vol. 341-342, pp. 34-44, Mar. 4, 2013.

(Continued)

*Primary Examiner* — Phillip A Johnston
(74) *Attorney, Agent, or Firm* — Steven M. Koehler; Westman, Champlin & Koehler, P.A.

(57) ABSTRACT

An ion trap such as an ion cyclotron resonance analyzer cell (trap) is described wherein the ion trap comprises a plurality of electrodes and has at least one integrated ion detector, preferably a position-sensitive and/or time-sensitive ion detector, wherein at least part of said ion detector is configured as an electrode of said ion trap. Methods of position-sensitive detection of ions in such ion trap are described as well.

20 Claims, 8 Drawing Sheets

(51) Int. Cl.
*H01J 49/06* (2006.01)
*H01J 49/40* (2006.01)
*H05K 1/02* (2006.01)

(52) U.S. Cl.
CPC ... *H05K 1/0206* (2013.01); *H05K 2201/0195* (2013.01)

(56) References Cited

U.S. PATENT DOCUMENTS

| | | | | |
|---|---|---|---|---|
| 6,888,134 B2* | 5/2005 | Hashimoto | ......... | H01J 49/0481 250/281 |
| 7,141,884 B2* | 11/2006 | Kojima | ............. | H01L 23/3121 257/774 |
| 7,579,589 B2* | 8/2009 | Miller | ................ | G01N 30/7206 250/281 |
| 7,928,371 B2 | 4/2011 | Ryjkov | | |
| 8,395,112 B1* | 3/2013 | Bier | ....................... | G01N 21/53 250/281 |
| 8,963,075 B2* | 2/2015 | Chen | .................. | H01J 49/4265 250/282 |
| 2008/0017794 A1 | 1/2008 | Verbeck | | |
| 2008/0142706 A1 | 6/2008 | Michelmann | | |

OTHER PUBLICATIONS

Vartanian et al., "Open cell analog of the screened trapped-ion cell using compensation electrodes for Fourier transform ion cyclotron resonance mass spectrometry," International Journal of Mass Spectrometry and Ion Processes, Elsevier Scientific Publishing Co., Amsterdam, NL, vol. 151, No. 2, Dec. 15, 1995.

S. Eliseev et al., "Phase-Imaging Ion-Cyclotron-Resonance Measurements for Short-Lived Nuclides," Physical Review Letters, vol. 110, No. 8, Feb. 19, 2013.

International Search Report and Written Opinion for corresponding International application No. PCT/EP2014/058402, dated Jul. 21, 2014.

Eitel et al., "Position-sensitive ion detection in precision Penning trap mass spectrometry."

Llopart et al., "Timepix, a 65 k quantum imager readout chip for arrival time, energy and/or event counting measurements," Nucl. Instr. and Meth. A 581, Oct. 21, 2007, pp. 485-494.

Korea Notice of Preliminary Rejection for Korean Patent Application No. 10-2015-7033298, dated Jul. 31, 2017.

* cited by examiner

DETECTION OF IONS IN AN ION TRAP

CROSS-REFERENCE TO RELATED APPLICATION

The present application is a national stage filing of International patent application Serial No. PCT/EP2014/058402, filed Apr. 24 2014, and published as WO 2014/174048 A1 in English.

FIELD

The invention relates to detection of ions in an ion trap and, in particular, though not exclusively, to an ion trap comprising an integrated pixelated ion detector, a detection system comprising an ion trap comprising an integrated ion detector and methods for detection of ions in an ion trap.

BACKGROUND

The discussion below is merely provided for general background information and is not intended to be used as an aid in determining the scope of the claimed subject matter.

Fourier transform ion cyclotron resonance mass spectrometry (FT-ICR MS) represents the highest spectral performance mass analyzer available. The high mass resolving power, high mass accuracy and high dynamic range enable high performance mass spectrometry from small molecules to intact proteins. Many tandem MS capabilities are amenable with FT-ICR MS, which include collision-induced dissociation (CID, both external and in-cell), infrared multiphoton dissociation (IRMPD), electron capture dissociation (ECD) and electron transfer dissociation (ETD). FT-ICR MS is the analyzer of choice for precision proteomics, top-down proteomics, mass spectrometry imaging and petroleomics.

In the presence of a strong magnetic field, an ion gains a rotational frequency that is inversely proportional to its mass. The relation is given by the cyclotron equation $\omega_c = qB/m$, wherein $\omega_c$ is the so-called unperturbed ion cyclotron frequency, q is the ionic charge, m is the ionic mass and B is the magnetic field strength. The ICR frequencies for common biological molecules fall in a very suitable range for commercial electronics (kHz to MHz range). The frequency of the ion cyclotron rotation can be measured very accurately, thus the mass measurement accuracy for FT-ICR MS is very high, easily in the parts-per-million or parts-per-billion range. This high mass accuracy allows for elemental composition assignment and thus improved identification capabilities over lower performance mass spectrometers. Similarly, since the detection period for FT-ICR is long and the frequency measured is high, the mass resolving power is high. This enables spectral separation of very closely spaced mass peaks.

One of the key challenges in mass spectrometry is the ability to accurately identify the molecular species analysed. The lack of mass resolving power can result in obscured spectral details when two closely neighbouring peaks are not resolved in the mass spectral domain. The high mass resolving power of FT-ICR MS easily resolves closely spaced mass peaks within less than 5 mDa (0.005 Da) mass units that would be difficult to resolve with lower performance mass spectrometers.

The cyclotron equation defines the "unperturbed" ion cyclotron frequency. However, experiments necessitate the axially confinement of ions in the FT-ICR analyzer cell. The application of a small electrostatic "trapping" potential affects the ion cyclotron measured frequency. Further, the presence of other m/z ions in the FT-ICR analyzer cell can lead to ion-ion interactions (or space charge effects), which further distort the electric field in the FT-ICR analyzer cell and thus change the ion cyclotron frequency.

To these ends, the simulation of ion motion in a FT-ICR analyzer cell has become a popular method for the study of these experimental necessities. Phenomena studied by simulation include, amongst others, ion cloud motion, peak coalescence and ion-ion interactions (space charge). Such high-performance computer simulations are powerful to examine the theoretical behaviour of ions inside the FT-ICR analyzer cell. The simulations allow important parameters (magnetic field, number of ions in the FT-ICR analyzer cell, electrostatic potentials, electrostatic trapping field geometry, starting position of the ions prior to excitation, excitation radius, excitation waveform type, etc.) to be varied. These simulations are however intrinsically limited by the computing time (which correlates with the accuracy of the modelling parameters). Understanding of the effects of these parameters on FT-ICR signal quality has led to new FT-ICR cell design geometries as well as important insight into FT-ICR experimental parameters for improved data quality and insight in the fundamentals of the ion motion. However, simulation results remain theoretical and comparison with experimental data is highly desirable.

From the above it follows that the known detection techniques for detecting ions in an ion trap suffer from a number of disadvantages that do not allow these detection techniques to be used as a useful tool in ion-trap applications such as FT-ICR spectrometry. Hence, there is a need for improved systems and methods for detecting ions in an ion trap. In particular, there is a need for improved systems and methods for detecting the spatial distribution and/or important parameters of ions in an ion trap inside a strong magnetic field and (ultra) high vacuum.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the background.

It is an objective of the disclosure to reduce or eliminate at least one of the drawbacks known in the prior art. In a first aspect the disclosure may relate an ion trap, preferably an ion cyclotron resonance analyzer cell (trap), comprising at least one integrated ion detector, preferably a position-sensitive and/or time-sensitive ion detector. In an embodiment, at least part of said ion detector may be configured as an electrode of said ion trap.

The ion trap according to the disclosure thus comprises a ion detector, preferably a position-sensitive and/or time-sensitive ion detector that allows direct imaging of the spatial distribution of both negative or positive ions in the ion trap and/or time-of-flight information associated with the ions in said trap. The ion detector forms an integral part of the ion trap thereby providing a very compact design that is suitable for locating said trap inside the bore of a (superconducting) magnet. Further, the ion trap allows examination of one or more ion ensembles for different parameters such as the m/z ratio and the spatial distribution of ions in the ion trap. The information measured by the ion detector may be used to study ion cloud movement, peak coalescence, ion-ion interactions (among others) and may be used in the verification of simulations and the determination of the optimal operation parameters for a FT-ICR mass spectrometer.

In an embodiment, the ion trap may comprise a plurality of electrodes for generating an electric trapping field for trapping said ions and/or for applying an electric excitation field, wherein said ion detector is integrated in at least one of said plurality of electrodes. Hence, the detector may be part of a trap electrode thereby allowing the detector to be very close the ions in the ion trap.

In an embodiment, said ion detector may comprise an array of pixel elements, wherein at least part of said pixel elements may comprise pixel read-out electronics or being connected to pixel read-out electronics. Hence, the ion detector may be a pixelated detector wherein each pixel may comprise electronics for processing information associated with the detection of ions in said ion trap. This way, the information of ions that are detected by the ion detector is processed in parallel thereby allowing time-resolved ion detection events such as measuring time-of-flight information of the ions.

In an embodiment, said ion detector may further comprise a detecting plate, said detecting plate comprising semiconductor layer and/or a micro-channel plate. The disclosure allows the integration of different types of ion detectors, including fully integrated ion detectors, hybrid-type ion detectors and ion detectors comprising a micro-channel plate or another event multiplier.

In an embodiment, at least part of said ion detector may connected to a voltage source for applying a voltage to said pixelated electrode, preferably said voltage biased part of said ion detector generating and/or manipulating an electrical field in said ion trap.

In an embodiment said read-out electronics may be configured for counting events associated with one or more ions interacting with said ion-detector and/or for determining time-of-flight information associated with one or more ions interacting with said ion-detector.

In an embodiment, said ion trap may further comprise a conductive grid mounted in front of the detecting face of said ion-detector, said conductive grid being connected to a voltage source for generating an electric field in said ion trap. Hence, further electrodes may be introduced to improving the formation and/or manipulation of the electric field inside the ion trap.

In an embodiment, said ion trap may be configured as an ion cyclotron resonance analyzer cell (trap). In an embodiment said ion trap may be configured as a cubic, rectangular, cylindrical or a hyperbolic trap.

In a further aspect, the disclosure may relate to a detection system for detection of ions in an ion trap comprising and ion trap as describe above. In an embodiment, the detection system may further comprise at least one voltage source for applying a voltage to at least on of the electrodes of said ion trap, said voltage source being configured to manipulate the electric field in said ion trap such that at least part of the ions in said ion trap move towards said ion detector.

In yet a further aspect, the disclosure may relate to a vacuum-compatible ion trap assembly comprising an ion trap according as described above. In an embodiment, the ion trap assembly may further comprise a chip carrier, preferably a printed circuit board (PCB), for carrying said ion detector, said chip carrier comprising: a top surface provided with one or more first electrical electrodes; a back surface provided with one or more second electrodes; and, one or more conductive wires embedded in said chip carrier electrically connecting said one or more first electrodes with said one or more second electrodes respectively; wherein said top surface is covered with a UHV sealing layer, preferably said first sealing layer comprising a liquid crystal polymer material.

In an embodiment, the ion trap may comprise at least a first thermally conductive layer extending at least partly over said top surface and at least a second thermally conductive layer extending at least partly over said back surface, said chip carrier further comprising one or more thermally conductive vias embedded in said PCB for thermally connecting said at least first thermally conductive layer with said second thermally conductive layer.

In an embodiment said ion detector may be in thermal contact with said first thermally conductive surface and wherein said second thermally conductive surface is in contact with a thermally conductive metal support block, preferably said detector assembly further comprising cooling means that is thermally connected to said support block for dissipating heat produced by said ion detector.

In an embodiment, said ion trap assembly may further comprise a read-out board comprising read-out electronics for reading data signals generated by said ion detector, wherein said read-out electronics are electrically connected via said first and second electrodes to said ion detector.

The disclosure may further relate to the use of an ion trap as described above in a mass spectrometer, preferably a Fourier transform ion cyclotron resonance mass spectrometer, wherein said ion detector is configured to measure the spatial distribution and/or time-of-flight information associated with ions in said mass spectrometer.

The disclosure may also be of an ion trap as described above wherein the ion trap is used in a high magnetic field, preferably said high magnetic field being selected between 0.1 and 50 T.

In another aspect the disclosure may relate to a method for detection of ions in an ion trap, preferably an ion cyclotron resonance analyzer cell (trap), wherein said ion trap comprises at least one integrated ion detector, preferably a position-sensitive and/or time-sensitive detector, wherein said method may comprise: providing one or more ions in said ion trap; manipulating the motion of the ions in said ion trap; and, detecting at least part of said ions and/or measuring time-of-flight information associated with at least part of said ions using said ion detector.

The disclosure will be further illustrated with reference to the attached drawings, which schematically will show embodiments according to the disclosure. It will be understood that the disclosure is not in any way restricted to these specific embodiments.

DETAILED DESCRIPTION OF THE ILLUSTRATIVE EMBODIMENTS

Figure 1:
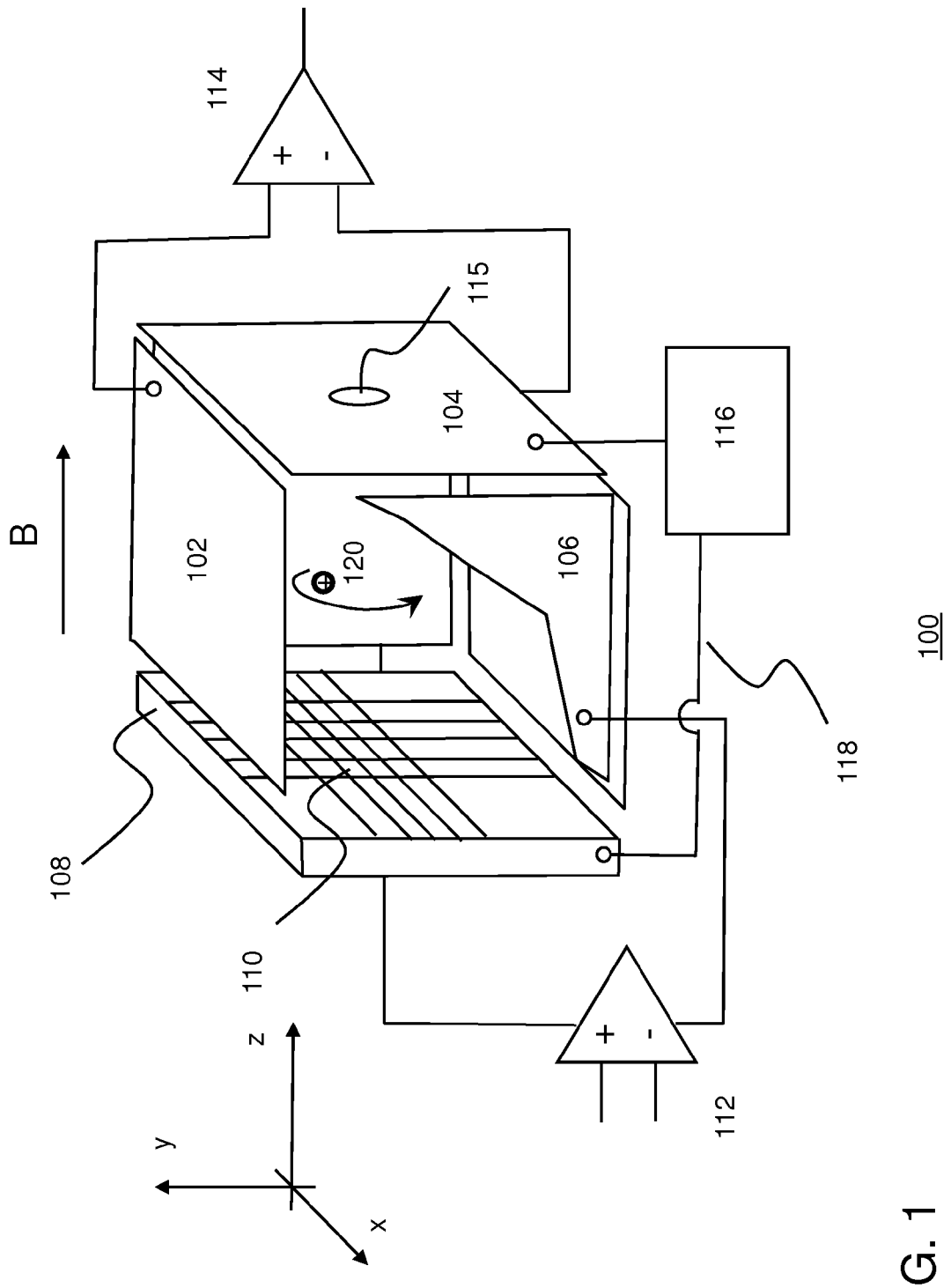
FIG. 1 depicts an ion trap according to an embodiment of the disclosure.

FIG. 1 schematically depicts an ion trap according to an embodiment of the disclosure. The ion trap may be placed in a strong homogeneous magnetic field of a (superconducting) magnet (not shown) that is configured to produce magnetic fields between 0.1 and 50 Tesla, preferably between 5 and 30 Tesla. Typically, the ion trap is placed within the bore of the magnet or between the poles of a permanent or electromagnet. The ion trap may further comprise a plurality of electrodes 102-108 wherein at least two (trapping) electrodes 104,108 may be used to generate an electric field, e.g. an electric "trapping" field for ions, such as a static electric trapping field, by applying a predetermined voltage to the electrodes.

Ions may be introduced in the trap via an aperture 115 in one of the electrodes. The magnetic field may confine ions 120 in the direction perpendicular to the magnetic field and the electric trapping field confines the ions in the axial direction. Due to the strong magnetic field, the ions will move in orbital motions in a plane that is perpendicular to the magnetic field. This orbital motion is referred to as the ion cyclotron motion. Opposing excitation electrodes 106 may be used to introduce an external time-dependent "excitation" electrical field for coherent acceleration of ions to an orbital radius sufficient for detection.

A mass spectrum of a group of ions may be generated using FT-ICR spectrometry by confining a group ions in the trap using a combination of magnetic and electric fields and applying an time-dependent "excitation" electrical field to the moving group of ions in order to excite them to larger orbits of their cyclotron motion. Under certain conditions ions with the same mass-charge ratio m/z will be coherently excited, wherein m is the mass of the ion and z is the number of elementary charges of the ion. The response of the excited ions can be measured by measuring image currents that are induced in the (detection) electrodes 102 of the ion trap. The response signal measured by the detection electrodes (representing a time domain signal) is amplified by measuring electronics 114, digitized and transformed to the frequency domain using a Fourier transform (not shown). The frequency signals appear as "peaks" in the frequency spectrum. These peaks may be associated with different ions of different mass-charge ratios. The frequency signals may be used to accurately calculate the mass-to-charge ratio m/z of the ions in the trap (via a frequency to mass calibration equation). Currently, Fourier transform ICR mass spectrometry is the most accurate types of mass spectrometry available.

In contrast with conventional ion trap designs, the ion trap according to the disclosure comprises a pixelated ion detector 108 that is integrated in the ion trap. The ion detector may be a position-sensitive x-y detector so that is may measure the spatial distribution of ions in the ion trap. In an embodiment, at least one of the electrodes of the ion trap may be part of the ion detector 110 of a pixelated ion detector 108. This way, the electrode may comprise pixels, i.e. spatially addressable (detection) elements 111, such as an ASIC, that may be arranged in an array. The pixels are associated with addressable physical coordinates thereby enabling position-resolved detection of charged particles, such as ions, that interact with the ion detector. The pixelated ion detector or at least part of the pixelated ion detector may be connected to a voltage source 116 so that it can be maintained at a certain bias voltage. This way, the pixelated ion detector may both function as a position-sensitive ion detector and as an electrode of the ion trap. The ion-detector is therefore an integral part of the ion trap, such that it is capable of directly measuring the ions inside the ion trap (in a high magnetic field) without the necessity of ejecting ions out of the trap (as required in prior art solutions). For the purpose of this application, the integrated ion detector that functions as an electrode of the ion trap may be referred to as an ion detector electrode.

In various embodiments, the ion detector electrode may function as a trapping electrode for generating a trapping electrical field for the ions, a detection electrode for measuring the response of the ions in the trap (i.e. (part of) the function of a conventional detector electrode of FT-ICR MS analyzer cell) and/or a excitation electrode for applying an electric excitation field to the ions.

When ions are confined within the trapping electrical field, the trapping electrical field may be manipulated so that the ions are no longer confined in the direction of the pixelated electrode so that the ions will start moving towards the pixelated electrode. In an embodiment, the trapping electrical field may be manipulated using the voltage bias of the ion detector electrode and/or a voltage biased conductive grid that is placed in front of the ion detector electrode. In an embodiment, the ions may hit the surface of the pixelated ion detector electrode. The ions may be detected by one or more pixel elements of the ion detector. In an embodiment, the pixel elements of the ion detector may be configured as separate discrete pixel elements, wherein each pixel comprises a sensor material that creates charge carriers when an ion interacts with it. The pixel electronics are configured to generate a signal that is proportional to the generated charge carriers. In another embodiment, the ion detector may comprise a continuous sensor layer wherein the backplane of the continuous layer is connected to discrete pixel elements that are configured to collect locally induced charge carriers due to impact of an ion. The (charge) signal associated with the detection of an ion may be used by the pixel detector to measure certain parameters, including counting the number ions that hit a pixel at a certain position within a certain time period (even counting) or determining the time-of-flight of an ion that hits a pixel after a trigger signal.

Hence, from the above it follows the integration of a ion-detector into an ion trap provides an a position-sensitive detection system that allows direct imaging of the spatial distribution of ions or an ion cloud inside an ion trap. In an embodiment, the ion trap may be configured as a FT-ICR MS analyzer cell that can be used in FT-ICR MS spectrometer. The detection system will be an integral part of the FT-ICR analyzer cell. This way, direct imaging of the spatial ion distribution in the x-y plane as projected onto the "back" trapping electrode of the FT-ICR MS cell may be achieved (i.e. perpendicular to the magnetic field which may be oriented in the z-axis).

In an embodiment, the ion detector electrode may be biased at voltages that allow the formation of an adequate trapping potential for the (back) trapping electrode of the analyzer cell. In an embodiment the bias voltage may be selected between 0 and 50 V either positive or negative voltage, preferably between 0.5 and 10 V, more preferably between 0.5 and 3 V. In an embodiment, a conductive grid may be mounted in front of the ion detector electrode. The grid may be connected to a bias voltage in order to provide an additional trapping potential which may enhance and/or homogenize the electrical potential on the ion detector electrode.

While the disclosure is described on the basis of an ion trap of a cubic design, it is apparent for the skilled person that the disclosure may be used in any kind of ion trap and/or ICR cell: i.e. a cubic or dual cubic cell, a (open and closed) cylindrical cell, a capacitively-coupled open cell, a Penning trap, a dynamically harmonized (leaf) cell, a 7-segmented (open or closed) compensated cell, a 7-segmented compensated cell, a window cell, an excite-coupled trapping ring electrode cell, etc.

Further different detector arrangements may be used. In an embodiment, the ion-detector electrode may comprise a tiled arrangement of two or more ion detectors. Tiling allows the formation of large active detection areas. In a further embodiment, two or more electrodes of the ion trap may be configured as ion-detector electrode. In yet another embodiment, instead of a trapping electrode, another electrode of the ion trap, e.g. a detection and/or an excitation electrode may be used, as the ion-detector electrode.

FIG. 2A-2D depict exemplary ion detector configurations for use in an ion trap according to an embodiment of the disclosure. FIGS. 2A and 2B depict a pixelated position-sensitive and/or time-sensitive ion detector of the hybrid type comprising a substrate 202 with pixel read-out electronics 206. In an embodiment, the pixel read-out electronics may be implemented as an Application-Specific Integrated Circuit (ASIC) that is bump bonded on the basis of soldering bumps 208 to a semiconductor sensor plate 204. In an embodiment, the semiconductor sensor plate may comprise a type IV semiconductor such as silicon.

In a further embodiment, diode regions 210 may be formed at the areas where soldering bumps contact the sensor plate. By locally implanting a silicon layer with a suitable dopant, e.g. a p-type dopant, pn junctions may be formed in the backside of the sensor plate wherein the diode regions may be connected to pixel read-out electronics using a suitable bonding and/or soldering technique. In further embodiments, the semiconductor detection plate may be structured in order to define pixels in the sensor plate. A top electrode 212 may be formed over the sensor plate for biasing the detection plate with respect to the backside of the detection plate so that ion-induced charge carriers may be efficiently guided to the pixel read-out electronics.

FIG. 2C depicts a detector arrangement comprising an pixelated detector 202 comprising integrated pixel read-out electronics 206 in combination with a micro-channel plate (MCP) 212 or another event multiplier. The MCP may be configured as an ion sensitive layer that generates an avalanche of secondary electrons in response to an incoming ion, wherein the secondary electrons may be detected by the pixelated detector. FIG. 2D depicts a detector arrangement wherein a "bare" pixelated detector is used as an ion detector. The detector may comprise ion-sensitive pixels comprising read-out electronics for generating a signal in case an ion is sensed.

Figure 2:
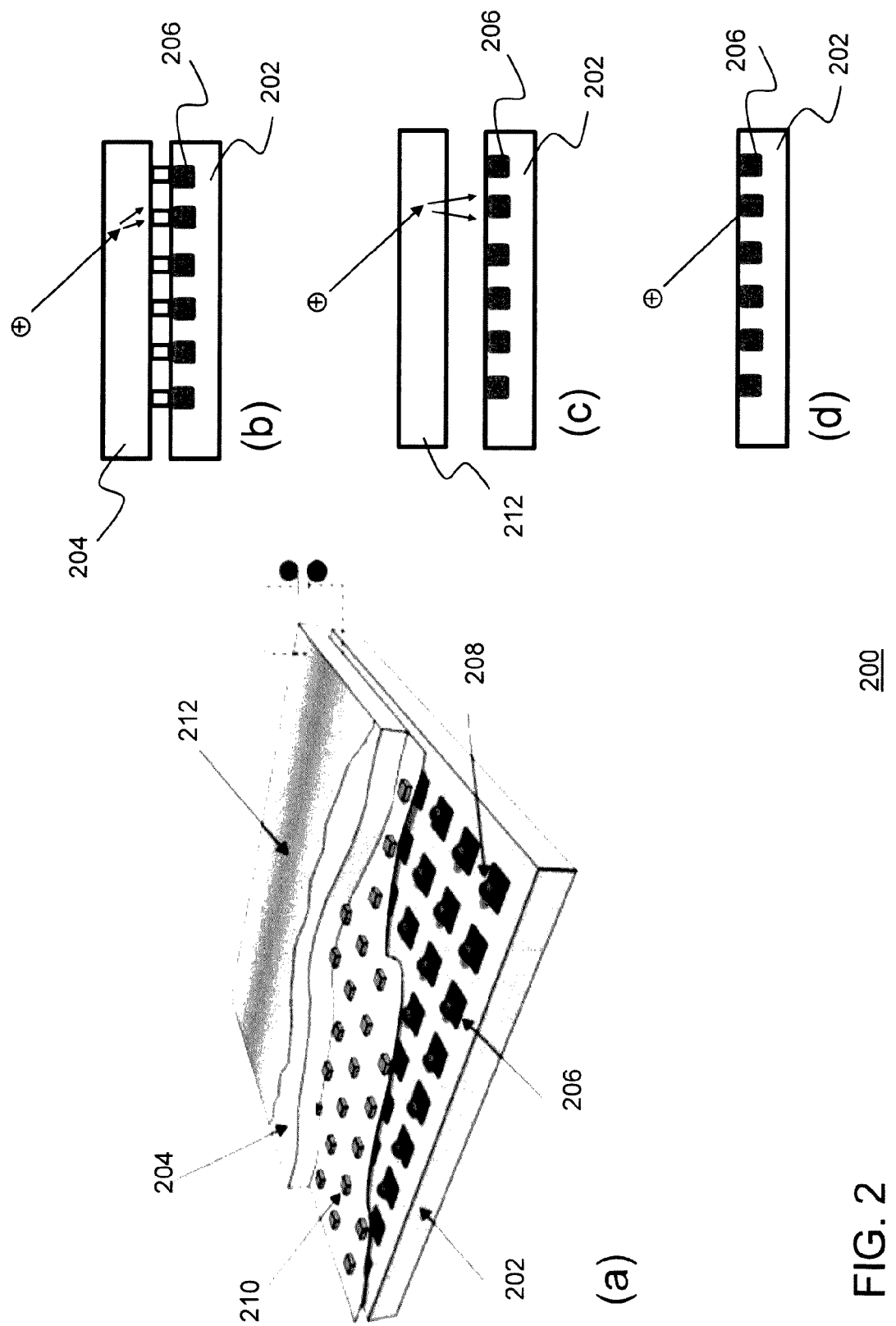
FIG. 2A-2D depict exemplary ion detector configurations for use in an ion trap according to an embodiment of the disclosure.

In an embodiment, the ion detector in FIGS. 2A and 2B may be (part of) a Timepix or a Medipix type ion-detector. These well-known detectors are for example described in the article by Llopart et. al. with title "Timepix, a 65 k quantum imager readout chip for arrival time, energy and/or event counting measurements" Nucl. Instr. and Meth. A 581, 21 Oct. 2007, Pages 485-494 and erratum Nucl. Instr. and Meth. A 585 (2008) 106. The Timepix detector may be implemented as a hybrid detector having a structure similar to the one illustrated in FIG. 2. The Timepix detector may also be used in combination with an MCP or an event multiplier as depicted in FIG. 2C or as a "bare" detector without the sensor plate as depicted in FIG. 2D.

The Timepix detector comprises 256×256 pixels per chip with a total active area of about 2 $cm^2$. The detectors may be used in a tiled arrangement. For example, the ion detectors may be arranged in a 2×2 tiled chip assembly in order to form an area around 28×28 $mm^2$. Each pixel is associated with pixel read-out electronics comprising a charge-sensitive amplifier for sensing positive and negative charges, an adjustable threshold for allowing detection of signals above a certain threshold and a reference clock for incrementing a counter that may be used for measuring the time-of-arrival (TOA) or time-over-threshold (TOT) time. Timepix chips are especially suitable for the detection of ions within an FT-ICR analyzer cell. In another embodiment said ion trap with position sensitive detection can be employed for beam quality monitoring and stabilization through a direct feedback loop.

It is submitted that many types of position-sensitive ion detectors may be used as a pixilated detector electrode for an ion trap. These detectors not only include hybrid type ion detectors such as the Timepix or Medipix detectors, but also fully integrated ion detectors that are based on CMOS type active pixel sensor technology. In such case, the semiconductor material for detecting the ions may be fabricated directly on top of a chip that comprises the pixel read-out electronics.

The detection system and readout electronics are adapted to function within the bore of a high-field (superconducting) magnet of between 0.1 and 50 Tesla. Moreover, preferably the detection system is compatible with ultra-high vacuum (UHV) (i.e. pressure around or lower than $10^{-9}$ mBar), which is important in order to achieve very accurate FT-ICR MS measurements. To that end, the ion detector is mounted on an UHV-compatible chip carrier such that the carrier functions as an electrical feed-through for the ion detector and as a UHV barrier between UHV inside the FT-ICR analyzer cell (around $10^{-9}$ mbar) and the ambient pressure environment outside the FT-ICR spectrometer.

Figure 3:
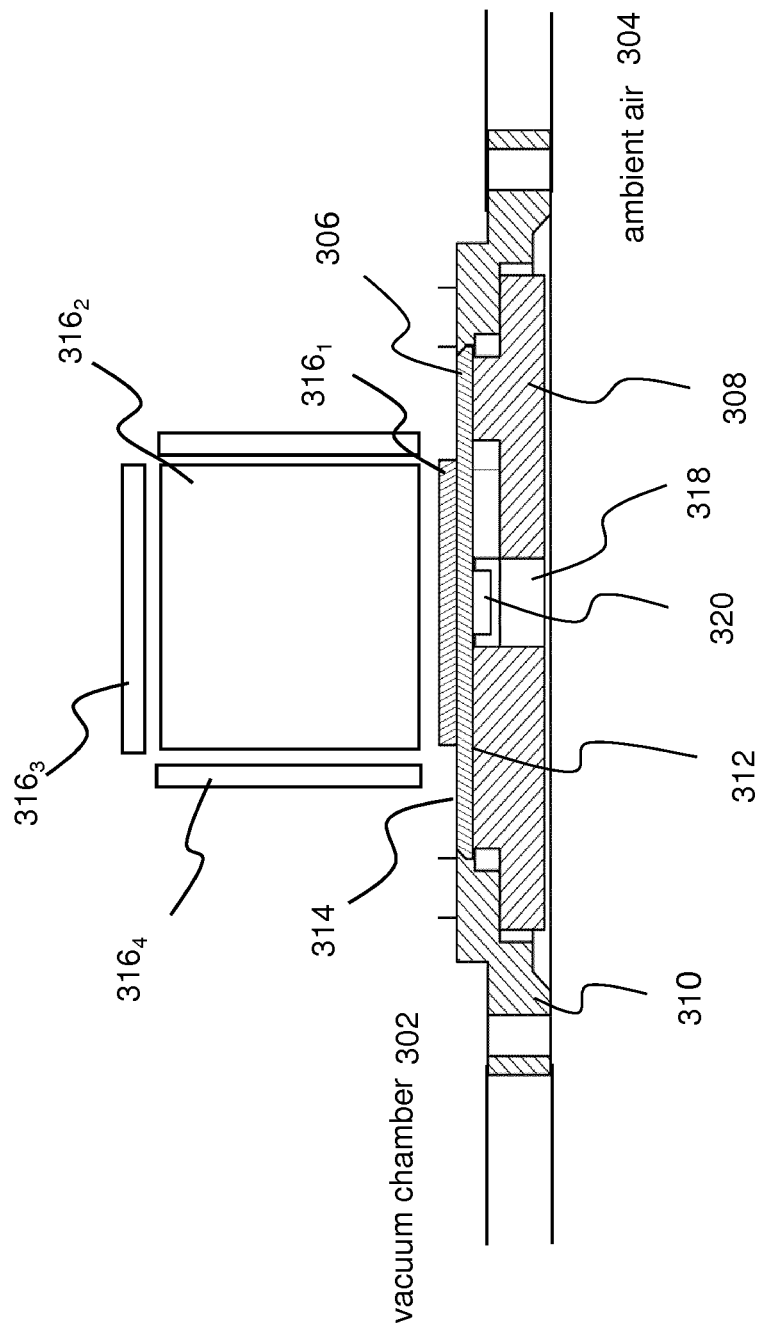
FIG. 3 depicts a schematic of the ion cell comprising an integrated position-sensitive ion detector that is mounted on electrical vacuum feedthrough structure according to an embodiment of the disclosure.

FIG. 3 depicts a schematic of the ion cell comprising an integrated position-sensitive ion detector that is mounted on electrical vacuum feedthrough structure according to an embodiment of the disclosure. In particular, FIG. 3 depicts an ion cell comprising an ion detector electrode $316_1$ that is mounted on an electrical vacuum feedthrough structure 306,308,310. The electrical vacuum feedthrough structure may function both as electrical ultra-high vacuum compatible chip carrier and as a vacuum seal between the detector in the vacuum chamber 302 and the read-out electronics of the detector in ambient air 304. The ion cell may comprise a plurality of electrodes $316_1$-$316_4$, wherein one of the electrodes $316_1$ is part of a pixilated electrode of a position-sensitive ion detector.

As will be shown hereunder in more detail, the electrical vacuum feedthrough structure may increase both the performance as well as the implementability and ease-of-use of the ion trap in ultra-high vacuum FT-ICR MS applications. The electrical vacuum feedthrough structure may comprise a printed circuit board (PCB) 306 mounted on a support structure. The support structure may comprise a support block 308 and a vacuum flange 310. The vacuum flange may be configured so that it can be fixed to an opening in the vacuum chamber, e.g. an opening of the vacuum chamber of the mass spectrometer.

The PCB has a first (back) surface 312, which is fixed to the support/cooling block, and a second (top) surface 314, on which one or more ion detectors 316 may be mounted. The PCB, which will be explained in more detail with reference to FIG. 4, may comprise a plurality of first electrical contacts, e.g. conductive (bonding) pads, located on its top surface, which are electrically connected to a plurality of second electrical contacts located on its back surface. Conductive lines embedded in the PCB may establish electrical connections between the first and second electrical contacts.

The one or more detectors in the vacuum chamber may be electrically connected to the plurality of first electrical contacts so that the detectors can be read-out by read-out electronics, which is electrically connected to the second electrical contacts at the backside of the PCB which is at ambient pressure.

Further, in an embodiment, a substantial part of the top surface of the PCB may be covered with a first thermal conductive layer and the back surface of the PCB may be covered with a second thermal conductive layer. In one embodiment, the thermal conductive layers may be metallic layers comprising aluminium, copper and/or silver. Thermal contact between the first and second layers may be established by a plurality of thermally conductive vias, which extend through the PCB. In an embodiment said at least one first and second thermally conductive layers may be thermally coupled to each other by a plurality of thermally conductive vias extending through said PCB. In an embodiment said plurality of thermally conductive vias forming an array having an array pitch selected between 2 and 20 mm. A detector may be fixed to the PCB by bonding it to the first thermal conductive layer using a suitable thermally conductive glue.

Similarly, the second thermal conductive layer may be fixed to the mounting block using a thermally conductive glue. The mounting block may be made from a thermally conductive material, preferably a metal comprising copper and/or aluminium. The thermal mounting block may be connected to a cooling element for cooling the block to a certain constant temperature. Hence, the PCB comprising the plurality of thermal conductive vias results in the realization of a very good thermal contact between the mounting block and the ion detector.

The mounting block may function as a thermal reservoir for dissipating the heat generated by the detectors during operation. The back-side of the mounting block, which is in ambient air, may be connected to a cooling element, comprising e.g. one or more Peltier elements or water-cooled elements, for cooling the mounting block and the detectors at a desired temperature. Cooling of the detector is important as a detector, such as the Medipix detector, may generate as much as 15 µW/pixel.

One or more openings 318 in the support block may expose part of the backside of the PCB including the second electrical contacts. In one embodiment, the second electrical contacts may be arranged in a connector 320, e.g. a standard electrical connector, which allows a fast connection to the read-out electronics of the detectors.

FIG. 4A-4C depict photos of the top and backside of the PCB and a schematic cross-section of the PCB 400. FIGS. 4A and 4B depict an exemplary PCB which is of circular shape. In this particular embodiment, the PCB has a diameter of about 50 mm and a thickness of about 1.6 mm. Depending on the application and/or the number of detectors, the PCB may have any suitable size. The top surface of the PCB may comprise first electrical contacts 402, e.g. bonding pads, for electrically connecting the signal leads of the detector(s) to second electrical contacts 404 at the back side of the PCB. These second electrical contacts may connected to an electrical connector 403 which is mounted on the backside of the PCB as shown in FIG. 4B.

Electrically conducting lines 406 embedded in the PCB material may electrically connect the first and second electrical contacts. The PCB may comprise a plurality (a large number) of contacts and embedded conductive lines so that it may function as a highly integrated electrical vacuum feedthrough. For example, depending on the particular application and/or the number of detectors mounted thereon, a PCB may comprise between 100 and 2000 conductive lines electrically connecting first electrical contacts at the top surface to second electrical contacts at the back surface.

In one embodiment, a multilayer PCB, e.g. a standard, multilayer FR-4 PCB, may be used. In other embodiments, other suitable PCB's may be used as well, including PCBs based on low temperature co-fired ceramics (LTCC) or high-temperature co-fired ceramics (HTTCC), one-, two- and multi-layer Metal Core PCB and/or ceramic PCB. The use of such PCBs bares the advantages of easy, cheap, reliable and well-established electrical design and fabrication. In addition, PCBs may be manufactured in various shapes (rectangular, circular) and sizes (from few mm up to tens of cm in diameter).

In one embodiment, at least the top-surface of the PCB is coated with an ultra-high vacuum sealant layer 405, which prevents the PCB from out-gassing. In embodiment, the UHV sealant layer may comprise a liquid crystalline polymer (LCP) material. In another embodiment, also the backside of the PCB may be coated with a UHV sealant layer 407 comprising a LCP material. The LCP material may prevent the PCB from out-gassing. A suitable LCP material such as R/Flex® 3600 Single Clad Laminate of Rogers Corporation may be used. In one embodiment, the edges of the PCB may be sealed with a metal layer 408 comprising e.g. copper and/or indium and/or gold to prevent out-gassing from the sides and to provide a metal surface for the vacuum seal between the mounting structure and the vacuum chamber.

In one embodiment, the edges of the PCB may be (partly) beveled under an angle (e.g. between 20 and 50 degrees). The support structure for the PCB may have an opening for receiving the PCB wherein the support structure has beveled edges, which are configured to receive the beveled edges of the PCB such that optimal vacuum sealing in the support structure is ensured.

Since the LCP-coated PCB functions as a vacuum seal, the connection between the PCB and the stainless steel support (vacuum flange) needs to be vacuum-tight. To that end, the vacuum flange may be machined such that the beveled edge of the chip carrier can be glued into the stainless steel support, which is beveled at the same angle as the PCB edge (see also FIG. 4C). A vacuum-compatible glue such as a two-component silver epoxy (Hysol TRA-DUCT 2902, Henkel, Düsseldorf, Germany) may be used. This way the UHV seal has a leak rate of less than $10^{-9}$ mbar·l/s.

In addition, the PCB is mechanically supported by a the support block, which prevents mechanical stress due to the pressure difference between the vacuum on the chip-side of the carrier and the ambient pressure on the electronics-side of the board. The PCB and the copper support may be connected using a thermally and electrically conducting glue, e.g. a two-component silver epoxy glue (EPO-TEK® EE129-4, Epoxy Technology, Inc., Billerica, USA). The support block may also function as a heat sink using one or more active cooling elements, such as a Peltier element and/or water cooling channels. The stainless steel support of the carrier may be connected to the vacuum chamber using a (1.5 mm) indium thread or viton o-ring. This way a leak rate of less than $10^{-9}$ mbar·l/s may be achieved.

Figure 5:
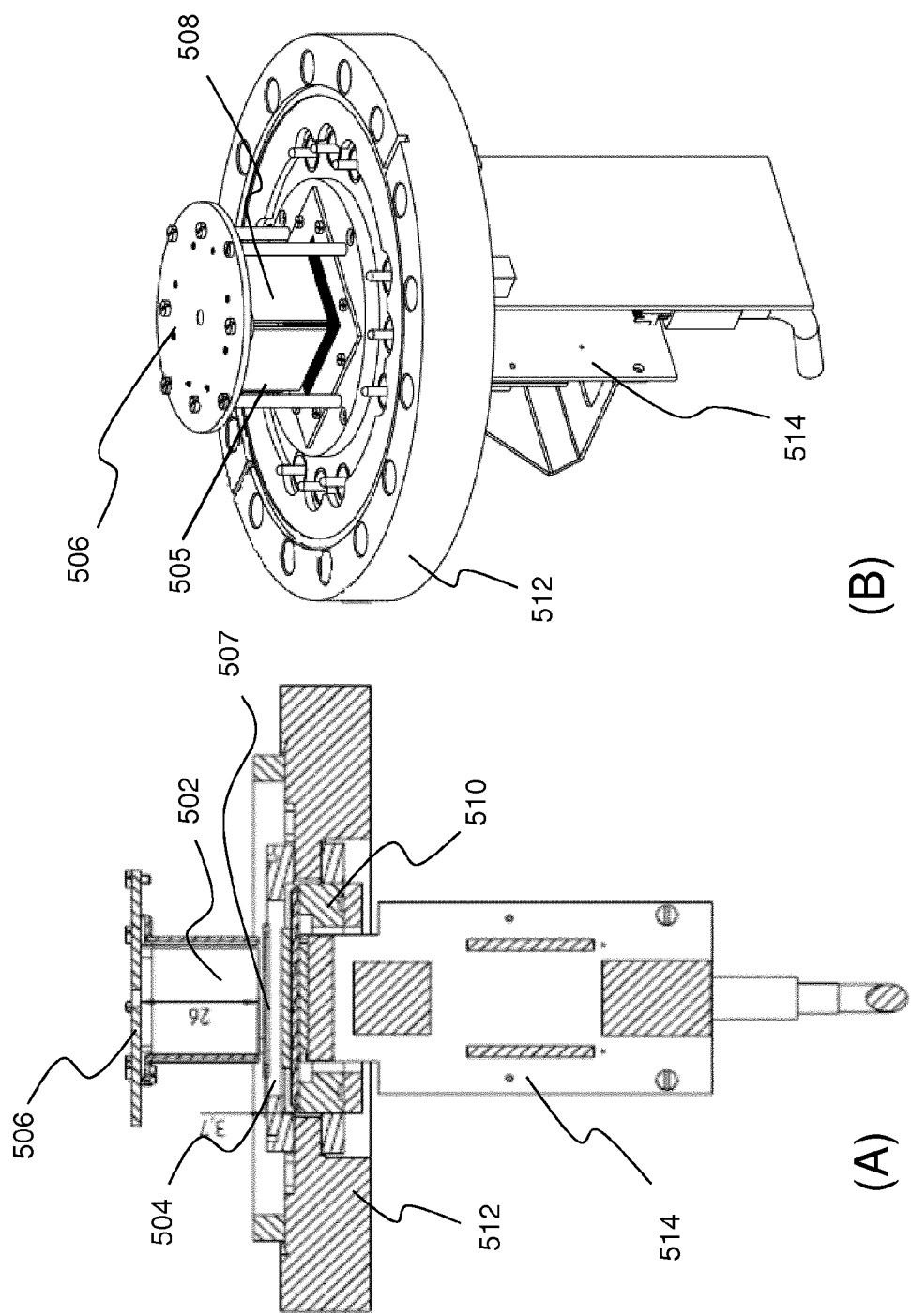
FIGS. 5A and 5B depict an ion trap assembly according to an embodiment of the disclosure according to an embodiment of the disclosure.

FIGS. 5A and 5B depict an ion trap flange assembly, in particular an FT-ICR MS analyzer cell flange assembly, according to an embodiment of the disclosure, wherein the ion trap is mounted onto an ultra high-vacuum compatible flange structure that may be used for mounting the ion trap into an UHV chamber of a mass spectrometer. FIG. 5A and FIG. 5B depict a cross-sectional view and a perspective view respectively of the flange structure, which comprises a cell comprising a plurality of electrodes 502-508, including a (back trapping) ion detector electrode 504 (that may comprise a (Timepix) ion detector and a conductive grid) and a front trapping electrode 506.

Figure 4:
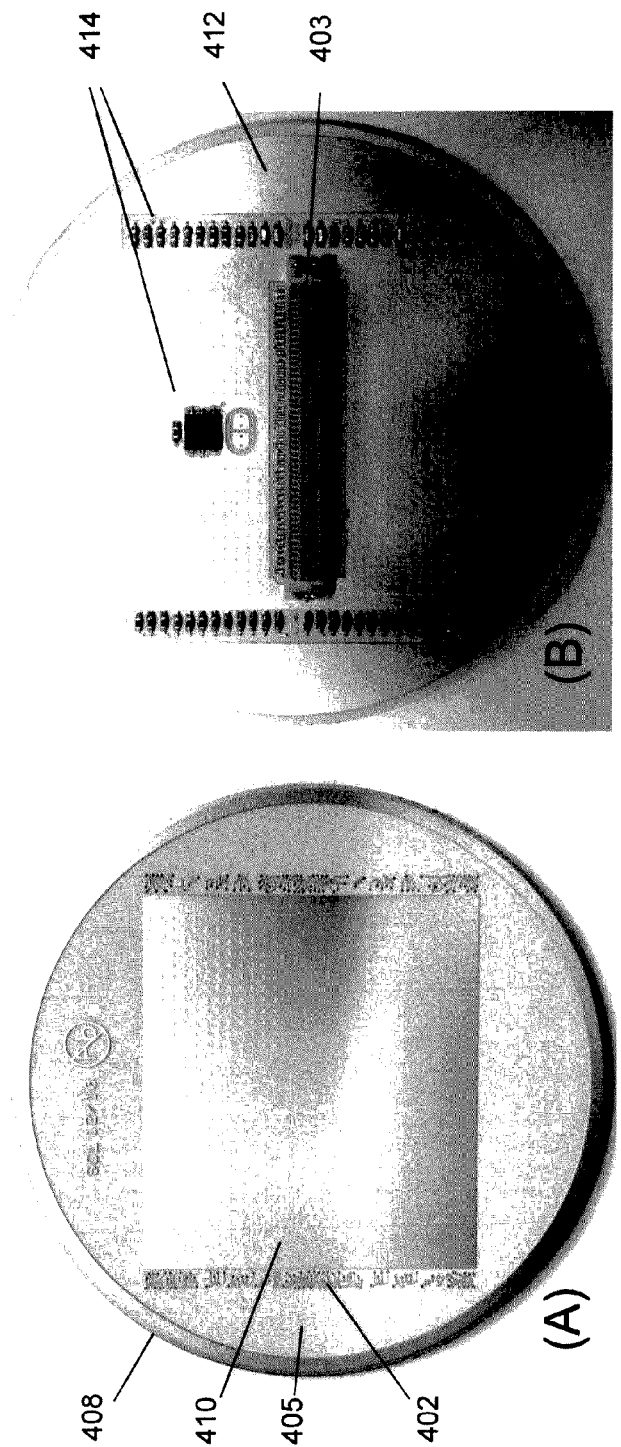
FIG. 4 depicts a cross-section of a detection system for position-sensitive detection according to an embodiment of the disclosure.
Figure 4:
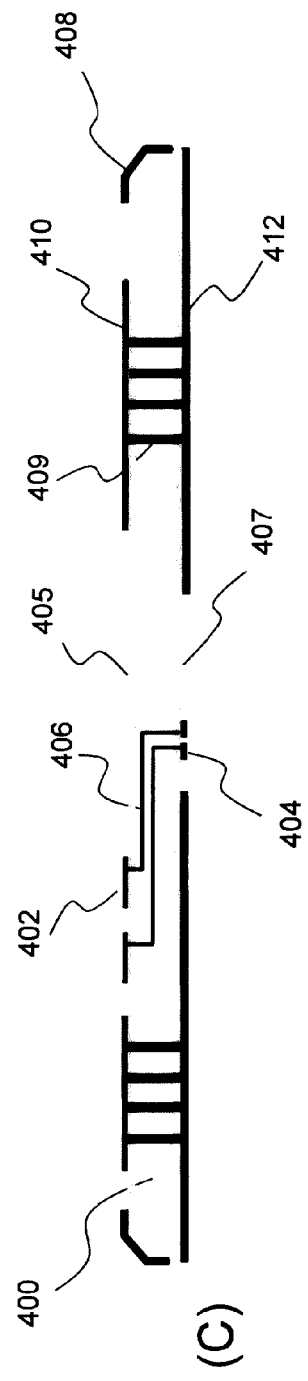

As already described in detail, an electrode of the ion trap, such as the trapping electrode, may be configured as an ion detector electrode that comprises one or more ion detectors such as one or more Timepix ion-detectors, that are mounted on an UHV-compatible PCB-based electrical feedthrough structure as described in detail with reference to FIG. 3-4.

As already described with reference to FIG. 3, the PCB may be mounted on a (copper) support block 510 thereby providing mechanical support for the PCB and at the same time functioning as a heat sink for the detectors. The support block may be mounted in a stainless steel flange structure 512. The support block may comprise one or more openings thereby exposing part of the backside of the PCB and the second electrical contacts, which may be connected to an electrical connector, which may provide an easy and direct connection to an ambient-air read-out interface board 514 in close vicinity of the in-vacuum ion-detector of the ion trap so that fast data exchange of more than 1 Gbit/s, preferably between 1 and 25 Gbit/s between the detectors and a data processing computer may be achieved. Cooling means, e.g. a ventilator, water-cooled elements and/or active cooling elements, may be coupled to the metal support block.

Figure 6:
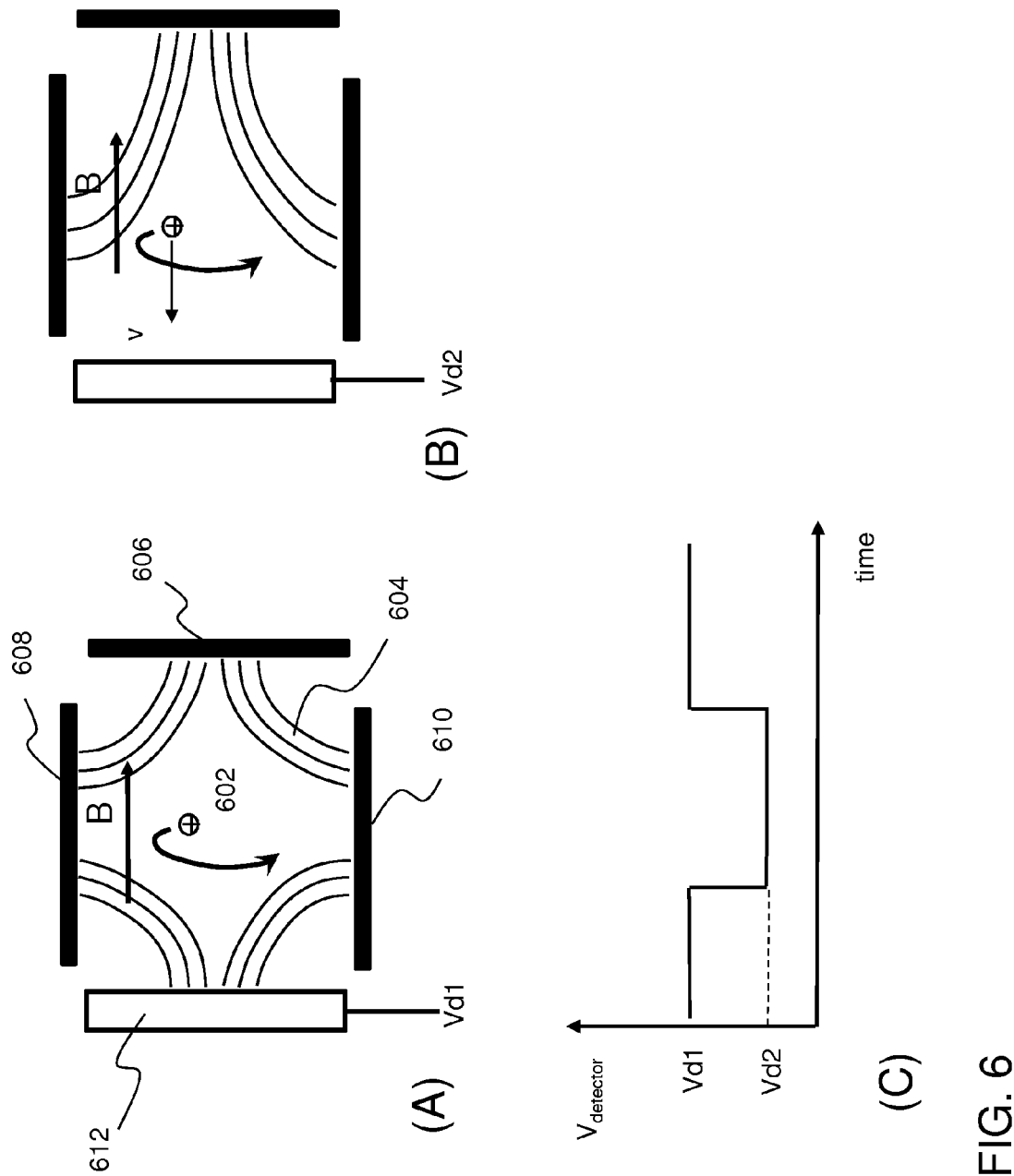
FIG. 6A-6C schematically depicts a method for position-sensitive detection of ions in an ion trap according to an embodiment of the disclosure.

The ion trap according to the disclosure may extend the use of such trap beyond the conventional detection of the charge induced in the detection electrodes of the ion trap. FIG. 6A-6C schematically depicts a method for position-sensitive detection of ions in an ion trap according to an embodiment of the disclosure. FIG. 6A depicts a moving ion 602 that is trapped in an electric trapping field 604 that is generated by the trapping electrodes 606-610 of the ion cell. In this particular example, the ion detector electrode 612 may be biased at a predetermined first bias voltage $V_{d1}$ so that it generates together with the front rapping electrode a trapping electrical field. Thereafter, the bias voltage may be changed to a second bias voltage $V_{d2}$ thereby modifying the trapping electrical field so that the ions move towards the pixelated electrode of the position sensitive detector as shown in FIG. 6B. The pixel signals associated with ions that interact with the pixelated electrode may be processed into an image of the spatial distribution of the ions in the ion trap. In another embodiment, the front trapping electrode 606 is raised to a voltage, such that the ion ensemble moves towards the ion detector electrode. In yet another embodiment the front and back trap electrode may be manipulated in a time dependent manner such that ion ensemble moves towards the ion detection electrode.

When using a Medipix or a Timepix ion-detector, the pixels maybe set in the particle counting mode, wherein each pixel may count the number of particles that hit the ion detector electrode. A "hit" may be counted if the signal is above a certain threshold value. In that way, the spatial ion distribution in an ICR cell may be studied using various parameters.

In an embodiment, the spatial ion distribution may be studied as a function of the ion cyclotron radius (the excitation amplitude), which may be varied by changing the amount of power applied by radio-frequency (RF) ion excitation (by a chirp excitation, on-resonance sinusoidal excitation or stored waveform inverse Fourier transform (SWIFT)). Here, the power may be varied by changing the RF amplitude or by changing the excitation time. In this way, the exact post-excitation radius in the ICR cell can be measured directly by the position-sensitive detector.

In another embodiment, the spatial ion distribution in the ICR cell may be studied as a function of the time after initial trapping of the ions in the cell. In the presence of a magnetic field, ions gain both cyclotron motion and magnetron motion. The longer the trapping time of the ion in the ICR cell, the more magnetron motion the ions gain.

In another embodiment, the spatial ion distribution in the ICR cell may be studied as a function of the external accumulation time (i.e. the number of ions in the ICR cell). This way, ion-ion interactions (space charge) can be studied. Effects of ion-ion interactions can be observed on the position sensitive detector, while spectral effects can be observed by normal FT-ICR operation.

Figure 7:
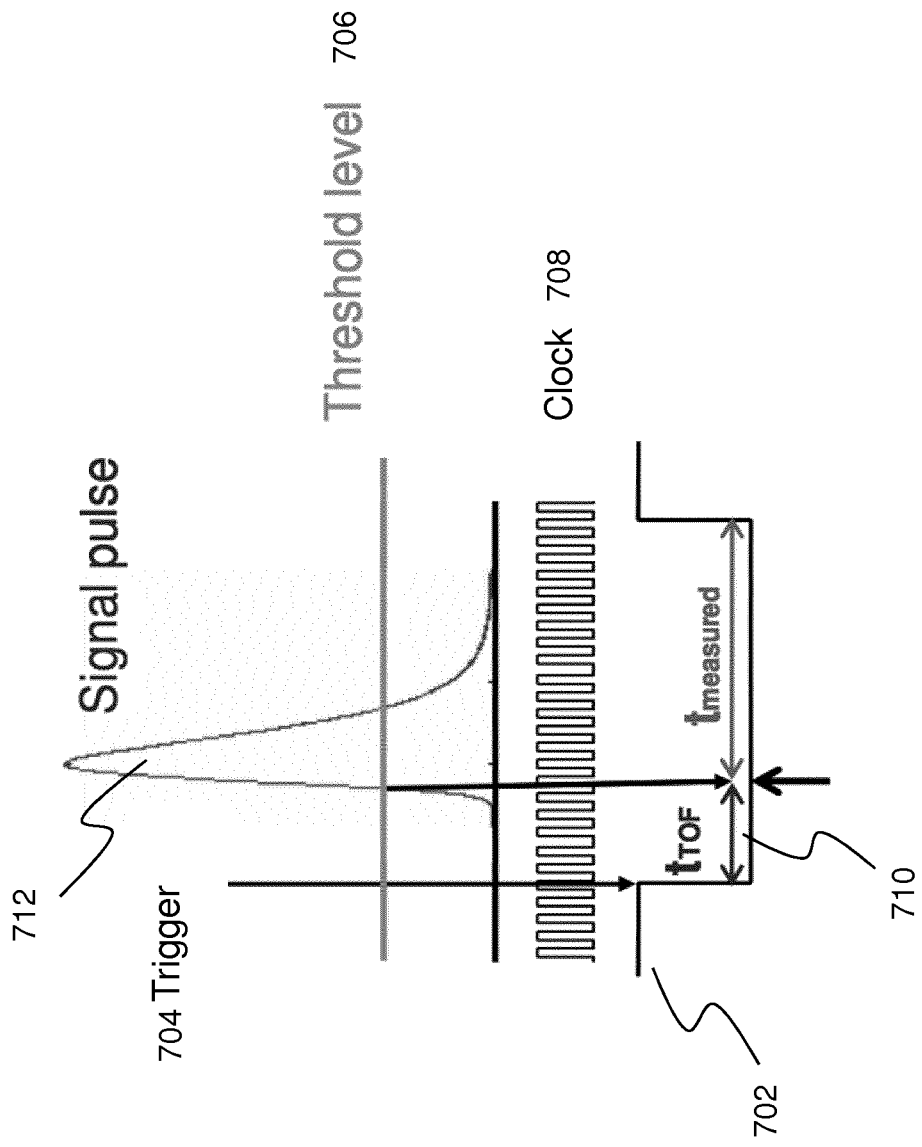
FIG. 7 schematically depicts the time-of-flight mode of a Timepix detector.

In yet another embodiment, the ion distribution in the ICR cell may be studied as a function of the trapping voltages on the front electrode and the back electrode of the cell. The effects of trapping voltage on the spectral quality can be measured by normal FT-ICR operation. When using a Timepix ion-detector the pixels may be set in a time-of-flight (TOF) mode as schematically depicted in FIG. 7. In this mode, an external shutter interval 720 may be started on the basis of a trigger signal 704. Upon generation of the trigger signal that may represent the start of one or more ions moving towards the pixelated electrode of the ion-detector, a digital counter in the pixel electronics that starts counting clock cycles (generated by a clock 708) until the end of the external shutter interval of length T. If during the shutter interval a signal 712 is detected (i.e. a signal that is above a predetermined threshold 706), a measuring time $t_{measure}$ 710 may be determined on the basis of the number of counted clock cycles. On the basis of measuring time, the time-of-flight may be determined as $t_{TOF}=T-t_{measure}$. In this mode, a number of different parameters and/or dependencies may be studied.

In an embodiment, the time-of-flight from external storage device to end of ICR cell (Timepix mode) may be measured. In this case, the ions may be "stored" in an external storage device (or multipole) by electrostatic and/or rf fields. The storage device may be located upstream from (closer to the ion source than the cell) the cell. Then, the ions may be ejected out of the storage device towards the cell. At the moment of ejection, a trigger signal is send to the Timepix so that it may measure the time-of-flight of the ions from the moment of ejection to the moment of arrival on the pixilated electrode of the ion trap as well as their spatial distribution. This time-of-flight measurement provides information on the time dynamics and beam focusing and transport characteristics within the spectrometer.

In another embodiment, the time-of-flight of ions in the ICR cell may be measured. In that case, the ions may be focussed/concentrated at the centre of the cell. Then, the electrical field in the ICR cell is changed such that ions move towards the pixelated electrode of the Timepix detector (which is part of the cell). The moment the ions are released a trigger signal is sent to the Timepix detector. The Timepix then registers the position of impact of the ions on the basis of the pixel locations; and, the time it takes for the ion to arrive in a specific location on the pixelated electrode. This information provides insight into the ion movement and time dynamics within the ICR cell.

In the above-mentioned experiments the ions interact with the pixelated electrode in that sense that the ion actually "hits" the pixelated electrode. In another embodiment, an ion may interact with the pixelated electrode on the basis of an induced current signal. In particular, an induced current may be measured when ions move close to the pixelated electrode of the Timpix ion-detector.

In that case, ions may circulate in the cell. Then, by carefully tuning the trapping field, the ions may be moved close to pixelated electrode of the Timepix detector without hitting it. These ions may induce a time dependent image charge at the pixels that are close moving ions. This measurement may provide insight in the nature of the ion movements in the cell.

Figure 8:
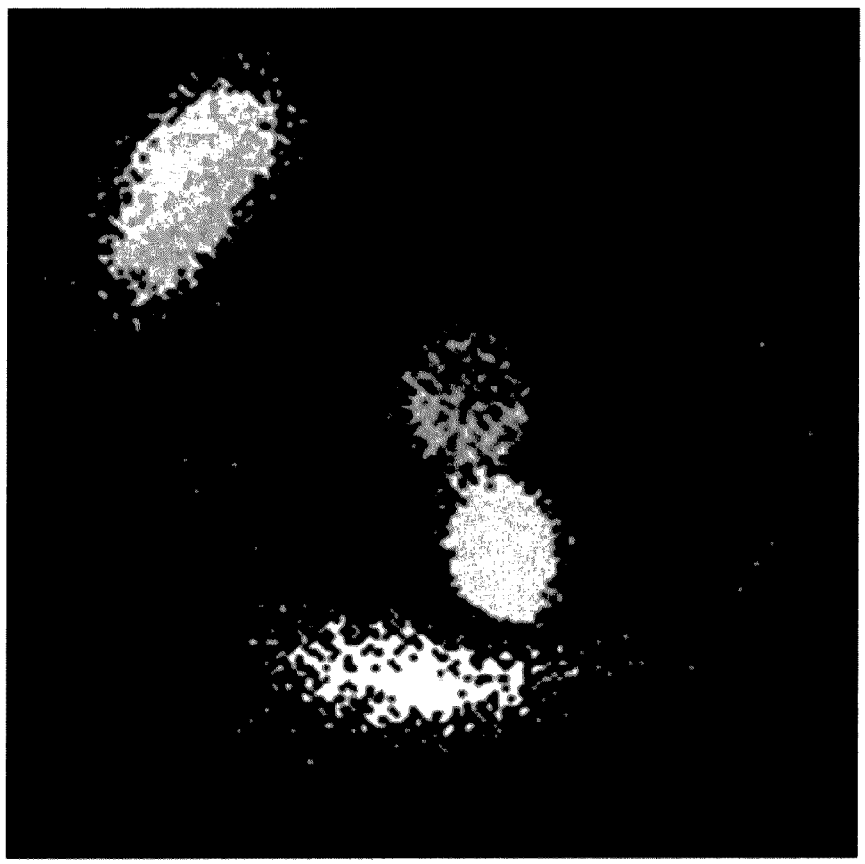
FIG. 8 depicts a computer simulation of an image generated by ions in an ion trap according to an embodiment of the disclosure.

FIG. 8 depicts a (high performance) computer simulation of an image generated by ions in an ion trap according to an embodiment of the disclosure. The images show the ion motion in an FT-ICR analyzer cell as they are projected onto the pixelated electrode of the position sensitive ion detector. The different clouds represent different charge states (m/z or m/q) of the protein cyctochrome C. By moving the ions axially (perpendicular to the magnetic field), the position of the ion clouds in the FT-ICR analyzer cell may be measured with the position-sensitive detector that is integral part of the cell.

It is to be understood that any feature described in relation to any one embodiment may be used alone, or in combination with other features described, and may also be used in combination with one or more features of any other of the embodiments, or any combination of any other of the embodiments.

The invention claimed is:

1. An ion trap, comprising at least one integrated pixelated ion detector, wherein at least part of said pixelated ion detector is configured as an electrode of said ion trap.

2. The ion trap of claim 1, wherein said ion detector comprises ion-sensitive pixels.

3. The ion trap of claim 1 and wherein the at least one ion detector comprises one or both of a position sensitive detector and a time sensitive detector.

4. The ion trap of claim 1, wherein said ion detector is configured to detect ions interacting with the ion detector.

5. The ion trap according to claim 1 further comprising: a plurality of electrodes for generating an electric trapping field for trapping said ions and/or for applying an electric excitation field, wherein said ion detector is integrated in at least one of said plurality of electrodes.

6. The ion trap according to claim 1, wherein said ion detector comprises an array of pixel elements, at least part of said pixel elements comprising pixel read-out electronics or being connected to pixel read-out electronics.

7. The ion trap according to claim 1, wherein said ion detector further comprises a detecting plate, said detecting plate comprising semiconductor layer and/or a micro-channel plate.

8. The ion trap according to claim 1 wherein at least part of said ion detector is connected to a voltage source for applying a voltage to at least part of said ion detector.

9. The ion trap according to claim 6 wherein said read-out electronics are configured to count events associated with one or more ions interacting with said ion-detector and/or for determining time-of-flight information associated with one or more ions interacting with said ion-detector.

10. The ion trap according to claim 1, wherein said ion trap further comprises a conductive grid mounted in front of the detecting face of said ion-detector, said conductive grid being connected to a voltage source for generating an electric field in said ion trap.

11. The ion trap according to claim 1, wherein said ion trap comprises an ion cyclotron resonance analyzer cell (trap).

12. The ion trap according to claim 1, wherein said ion trap is configured as a cubic, rectangular, cylindrical or a hyperbolic trap.

13. The detection system for detection of ions in an ion trap comprising:
an ion trap according to claim 1;
at least one voltage source for applying a voltage to at least one of the electrodes of said ion trap, said voltage source being configured to manipulate the electric field in said ion trap such that at least part of the ions in said ion trap move towards said ion detector.

14. An ion trap assembly comprising:
an ion trap according to claim 1;
a chip carrier, preferably a printed circuit board (PCB), for carrying said ion detector, said chip carrier comprising: a top surface provided with one or more first electrical electrodes; a back surface provided with one or more second electrodes; and, one or more conductive wires embedded in said chip carrier electrically connecting said one or more first electrodes with said one or more second electrodes respectively; wherein said top surface is covered with a UHV sealing layer, preferably said first sealing layer comprising a liquid crystal polymer material.

15. The ion trap assembly according to claim 14 comprising:
at least a first thermally conductive layer extending at least partly over said top surface and at least a second thermally conductive layer extending at least partly over said back surface, said chip carrier further comprising one or more thermally conductive vias embedded in said PCB for thermally connecting said at least first thermally conductive layer with said second thermally conductive layer.

16. The use of an ion trap according to claim 1 in a mass spectrometer, wherein said ion detector is configured to measure the spatial distribution and/or time-of-flight information associated with ions in said mass spectrometer; and/or, use of an ion trap according to claim 1 in a high magnetic field.

17. Use of an ion trap according to claim 16 wherein the mass spectrometer comprises a Fourier transform ion cyclotron resonance mass spectrometer.

18. Use of an ion trap according to claim 16 wherein the high magnetic field is between 0.1 to 50 T.

19. A method for detection of ions in an ion trap, wherein said ion trap comprises at least one integrated pixelated ion detector, and wherein at least part of said pixelated ion detector is configured as an electrode of said ion trap, said method comprising:

providing one or more ions in said ion trap;
manipulating the motion of the ions in said ion trap;
detecting at least part of said ions and/or measuring time-of-flight information associated with at least part of said ions using said ion detector.

20. The method of claim 19 wherein the ion trap comprises an ion cyclotron resonance analyzer cell (trap), and the at least one integrated in detector comprises a position-sensitive and/or time-sensitive detector.

\* \* \* \* \*